(12) United States Patent
Cheng (10) Patent No.: US 12,342,738 B2
(45) Date of Patent: Jun. 24, 2025

(54) RESISTIVE MEMORY FOR ANALOG COMPUTING

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 592 days.

(21) Appl. No.: 17/482,493

(22) Filed: Sep. 23, 2021

(65) Prior Publication Data
US 2023/0089791 A1    Mar. 23, 2023

(51) Int. Cl.
*H10N 70/00*    (2023.01)
*G11C 13/00*    (2006.01)
*H10B 63/00*    (2023.01)

(52) U.S. Cl.
CPC ....... *H10N 70/883* (2023.02); *G11C 13/0026* (2013.01); *G11C 13/0028* (2013.01);
(Continued)

(58) Field of Classification Search
CPC .. H10N 70/883; H10N 70/061; H10N 70/841; H10N 70/011; H10N 70/24;
(Continued)

(56) References Cited

U.S. PATENT DOCUMENTS 9,178,148 B2    11/2015    Hashim et al.
9,203,022 B2    12/2015    Hopstaken et al.
(Continued)

FOREIGN PATENT DOCUMENTS

CN    110137348 A    8/2019
WO    2013/039603 A1    3/2013

OTHER PUBLICATIONS

Chang et al., "Physical Mechanism of HfO2-based Bipolar Resistive Random Access Memory," Symp. VLSI-TSA, Apr. 2011, pp. 2.
(Continued)

*Primary Examiner* — Allison Bernstein
(74) *Attorney, Agent, or Firm* — Scully, Scott, Murphy & Presser, P.C.; Kimberly S. Zillig (57) ABSTRACT

A memory device is provided that includes a method and structure for forming a resistive memory (RRAM) which has a gradual instead of abrupt change of resistance during programming, rendering it suitable for analog computing. In a first embodiment: One electrode of the inventive RRAM comprises a metal-nitride material (e.g., titanium nitride (TiN)) with gradually changing concentration of a metal composition (e.g., titanium). Different Ti concentrations in the electrode results in different concentration of oxygen vacancy in the corresponding section of the RRAM thereby exhibiting a gradual change of resistance dependent upon an applied voltage. The total conductance of the RRAM is the sum of conductance of each section of the RRAM. In a second embodiment: a RRAM with one electrode having multiple forks of electrodes with different composition concentration and thus different switching behaviors, rendering the inventive RRAM changing conductance gradually instead of abruptly.

6 Claims, 7 Drawing Sheets

(52) U.S. Cl.
CPC ......... *G11C 13/0069* (2013.01); *H10B 63/82* (2023.02); *H10N 70/061* (2023.02); *H10N 70/841* (2023.02)

(58) Field of Classification Search
CPC ............. H10N 70/823; H10N 70/8833; G11C 13/0026; G11C 13/0028; G11C 13/0069; H10B 63/82; H10B 63/80
See application file for complete search history.

(56) References Cited

U.S. PATENT DOCUMENTS

| | | | |
|---|---|---|---|
| 9,231,199 B2 * | 1/2016 | Lee | H10N 70/883 |
| 9,564,587 B1 * | 2/2017 | Jo | H10N 70/011 |
| 9,786,368 B2 | 10/2017 | Wang et al. | |
| 9,887,351 B1 | 2/2018 | Ando et al. | |
| 10,529,921 B2 | 1/2020 | Chu et al. | |
| 10,553,793 B2 | 2/2020 | Jha et al. | |
| 2008/0079029 A1 | 4/2008 | Williams | |
| 2009/0289243 A1 | 11/2009 | Xi et al. | |
| 2010/0264397 A1 | 10/2010 | Xia et al. | |
| 2013/0062588 A1 | 3/2013 | Sakotsubo | |
| 2015/0154469 A1 | 6/2015 | Park et al. | |
| 2020/0176512 A1 | 6/2020 | Conti et al. | |
| 2020/0219933 A1 | 7/2020 | Cheng | |

OTHER PUBLICATIONS

International Search Report and Written Opinion received in PCT/EP2022/075615 dated Jan. 25, 2023, 13 pages.

* cited by examiner

FIG. 9

US 12,342,738 B2

RESISTIVE MEMORY FOR ANALOG COMPUTING

FIELD

The present application relates to a semiconductor memory device and a method of forming the same. More particularly, the present application relates to an analog resistive memory device structure and/or method of fabricating an analog resistive memory.

BACKGROUND

RRAM is considered a promising technology for electronic synapse devices or memristors for neuromorphic computing as well as high-density and high-speed non-volatile memory applications. RRAM is a type of non-volatile random access memory that works by changing the resistance across a dielectric solid-state material. The basic idea is that the dielectric solid-state material, which is normally insulating, can be made to conduct through a filament or conduction path formed after application of a sufficiently high voltage. The conduction path can arise from different mechanisms, including vacancy or metal defect migration. Once the filament is formed, it may be reset (broken, resulting in high resistance) or set (re-formed, resulting in lower resistance) by another voltage. Many current paths, rather than a single filament, are possibly involved.

In neuromorphic computing applications, a resistive memory device can be used as a connection (i.e., synapse) between a pre-neuron and a post-neuron, representing the connection weight in the form of device resistance. Multiple pre-neurons and post-neurons can be connected through a crossbar array of RRAMs, which naturally expresses a fully connected neural network.

Moreover, nonvolatile RRAM memory has emerged as a viable device for storage and analog computing, e.g., especially due to its compatibility for CMOS logic processing.

However, in current designs, the resistance of current RRAM devices exhibit abrupt changes when responding to electrical pulses, so such RRAM devices are not suitable for analog computing in artificial intelligence (AI) applications.

SUMMARY

The present application provides an analog resistive memory device, i.e., a resistive random access memory (RRAM) cell, with at least one electrode having varying compositions so that the resistance of the inventive RRAM changes gradually.

In an aspect, the RRAM structure is capable of exhibiting a gradual change of resistance, e.g., in response to electrical pulses/voltage levels, thereby rendering it suitable for AI applications.

The provided RRAM structure capable of exhibiting a gradual change of resistance operation is formed as a 2-terminal RRAM cell and includes an electrode with gradually varying compositions to make a RRAM change its resistance gradually in response to electrical pulses/voltage levels.

The present application provides a method for forming a RRAM structure capable of exhibiting a gradual change of resistance in response to electrical pulses/voltage levels, thereby rendering it suitable for AI applications.

According to first aspect, there is provided a resistive memory device. The resistive memory device comprises: a first metal electrode layer having a varying metal material composition; a resistive dielectric material layer over a top surface and a sidewall surface of the first electrode; and a second metal electrode over the resistive dielectric material layer.

According to further aspect, there is provided a resistive memory device. The resistive memory device comprises: a stack of alternating first metal electrode material layers and insulating material layers therebetween, each successive first metal electrode material layer of the stack having a different metal material composition; a resistive dielectric material layer on a top surface and sidewall surface of the stack; and a second metal electrode over the resistive dielectric material layer, wherein the conductance of the resistive memory device changes gradually during application of a voltage applied between the stack of the alternating first metal electrode material layers and the second metal electrode.

In accordance with another aspect, there is provided a method of forming a memory device. The method comprises: forming a first electrode layer on a substrate wherein the first electrode has varying metal material composition; patterning the first electrode to expose a sidewall; depositing a resistive element on the sidewall of the first electrode; and forming a second electrode over the resistive element.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
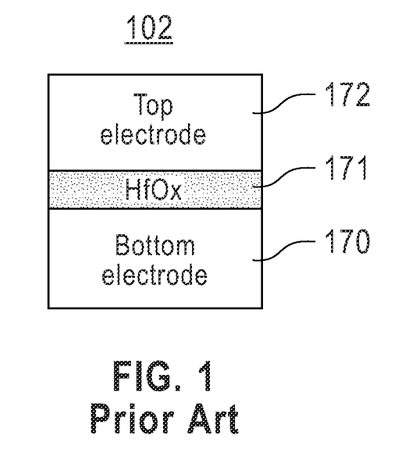
FIG. 1 shows a resistive (memory storage) element of a RRAM storage device according to an embodiment.

Referring first to FIG. 1, there is illustrated an exemplary resistive element R 102 of a Resistive RAM (RRAM) storage device. Such resistive element 102 is a simple metal-insulator-metal (MIM) structure including a "high-k" dielectric material, e.g., a transition metal oxide that is formed between a top electrode 172, a bottom electrode 170. The middle layer can be a material, e.g., $HfO_2$. In embodiments, the storage cell metal electrodes can include materials such as Pt, TiN, Ti, Ru, Ni, TaN, W, etc. deposited by physical vapor deposition (PVD) processes while the middle layer 171 of transition metal oxide material such as, $HfO_x$, $TiO_x$, $NiO_x$, $WO_x$, $TaO_x$, $VO_x$, $CuO_x$, etc. can be deposited by atomic layer deposition (ALD) processes.

The transition metal oxide that is formed between a top electrode 172 (e.g., an anode) and a bottom electrode (e.g., a cathode) of the RRAM device 102 includes an HfOx switching medium situated between two electrodes. Conductive filaments can be formed between the two electrodes to provide a conducting path between the electrodes. The filaments can be formed by applying an appropriate amount of voltage to the RRAM device that program the resistive element 102 to store a logic or weight value corresponding to either a high-resistance cell state, a low-resistance cell state, or other resistive states.

As known from the reference to H.-L. Chang entitled "*Physical Mechanism of HfO2-based Bipolar Resistive Random Access Memory,*" Symp. VLSI-TSA, 2011, the resistance switching between high resistance state (HRS) and low resistance state (LRS) of $HfO_2$-based RRAM is based on the formation and rupture of Hf filaments via an electrochemical redox process in a region of a few nm near the metal terminal (i.e., anode).

Figure 2A:
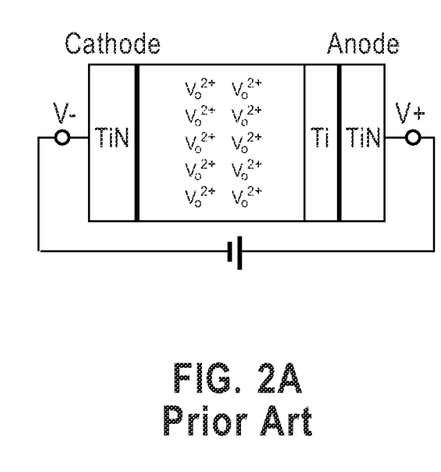
FIGS. 2A-2C depict the role oxygen vacancies play in the resistance switching of RRAM cell as shown in the RRAM cell in the figures.
Figure 2B:
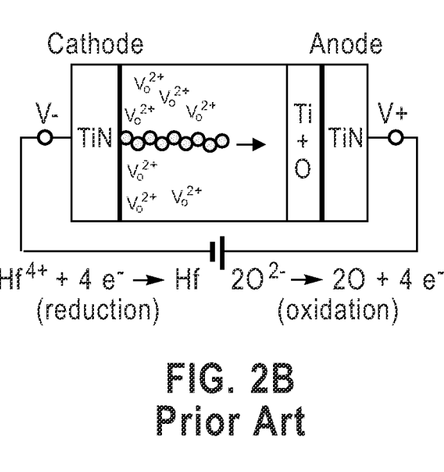
Figure 2C:
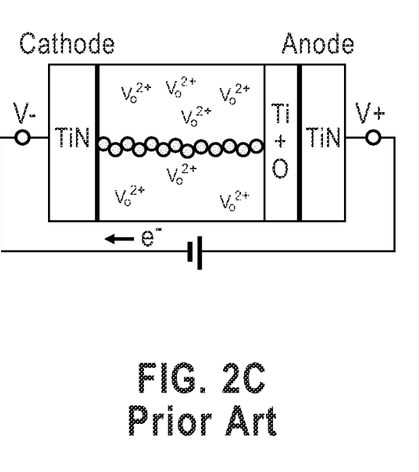

For example, shown in FIG. 2A-2C is the role oxygen vacancies play in the resistance switching of RRAM cell as shown. In particular, there are two types of oxygen vacancies in $HfO_2$: (1) $HfO^{2+}$ ($V_o^{2+}$) if one oxygen atom is missing, and (2) $Hf^{4+}$ if two oxygen atoms are out of place. The positively charged oxygen vacancies are mobile under high field and serve like donor dopants to make $HfO_2$-based RRAM n-type semiconductor. As known, a forming process produces a sufficient amount of oxygen vacancies in $HfO_2$ to initiate the resistance switching. As shown in FIGS. 2B and 2C, under high positive voltage, the $O^{2-}$ ions move into the Ti layer by diffusion and/or drift under high field, and then oxidize at anode in an oxidation operation according to:

$$2O^{2-} \rightarrow 2O + 4e^-$$

while the Hf4+ ions (a type of oxygen vacancies) reduce at cathode in a reduction operation according to:

$$Hf^{4+} + 4e^- \rightarrow Hf$$

As shown in FIG. 2B, one or many Hf filaments grow from cathode to anode, making RRAM exhibit LRS after forming. Under a negative voltage, a reverse redox process happens near the anode. The O in Ti layer reduces, releasing $O^{2-}$ ions back into $HfO_2$ in a reduction operation according to:

$$2O + 4e^- \rightarrow 2O^{2-}$$

while Hf filaments oxidize to have $Hf^{4+}$ ions in an oxidation operation according to:

$$Hf \rightarrow Hf^{4+} + 4e^-$$

The recombination of $Hf^{4+}$ and $O^{2-}$ according to:

$$Hf^{4+} + 2O^{2-} \rightarrow HfO_2$$

causes the filaments to rupture partially (a few nm) near the anode, making RRAM exhibit HRS after a RESET. Once a positive voltage (<forming voltage) is applied, the filaments form again in the rupture region, switching RRAM back to LRS after SET. The rupture and reformation of the Hf filaments occurring in a few nm near anode explains the high-speed (<5 ns) switching of the RRAM.

Thus, an initial state of most RRAM devices is a High Resistance State (HRS), in which the RRAM resistance is considered higher than a specific value. The first operation to turn the RRAM device to the Low Resistance State (LRS) is the "forming" operation. The LRS resistance is preferred to be smaller than the HRS resistance by a sufficient amount so that a supporting circuit is able to discern the RRAM state unambiguously. In the "forming" operation in which an applied voltage across the device exceeds a certain level, i.e., a forming voltage, the RRAM cell responsively starts changing its state from HRS to LRS. In a circuit, the maximum current of the RRAM device can be constrained by a current limiter, e.g., a transistor (not shown).

After the forming operation in which the RRAM devices are rendered into a LRS, to transition the RRAM device operation between low resistance and high resistance states, a reset operation is performed in which the applied voltage across the device sweeps negatively and upon exceeding a certain "reset" voltage limit, the RRAM device will change the state from LRS back to HRS. This process is called a RESET operation. When the voltage changes to positive again and exceeds another "set" voltage limit, the RRAM will change its state from HRS to LRS. This process is called a SET operation. The RRAM device can be worked back and forth between HRS and LRS by respective RESET and SET operations wherein a sufficiently low negative voltage RESETs the device, and a sufficiently high positive voltage can SET the device.

The present embodiment provides a method and structure for forming resistive memory (RRAM) cells. For HfOx-based RRAM, changing resistance of HfOx relies on adding or extracting oxygen vacancies in HfOx.

In an embodiment herein, there is formed a RRAM cell with gradual changing Ti % (Ti % is the concentration of titanium) in a TiN (titanium nitride) electrode. Generally, the principles herein are applicable to RRAM cells having a metal-nitride material electrode and gradually changing the metal concentration. In the case of a TiN material electrode, different titanium (Ti) concentrations in the electrode results in different concentration of oxygen vacancy in the corresponding section of the RRAM. The total resistance of the inventive RRAM is equivalent to multiple RRAM with different concentration of oxygen vacancy (thus different resistance change as a response to number of pulses or voltage).

In an embodiment, a semiconductor manufacturing method provides a first step of depositing a TiN bottom electrode with gradually changing Ti %, patterning the TiN bottom electrode, and then forming HfOx on TiN sidewalls so that different height of HfOx butting different Ti % sections of TiN bottom electrode.

Figure 3:
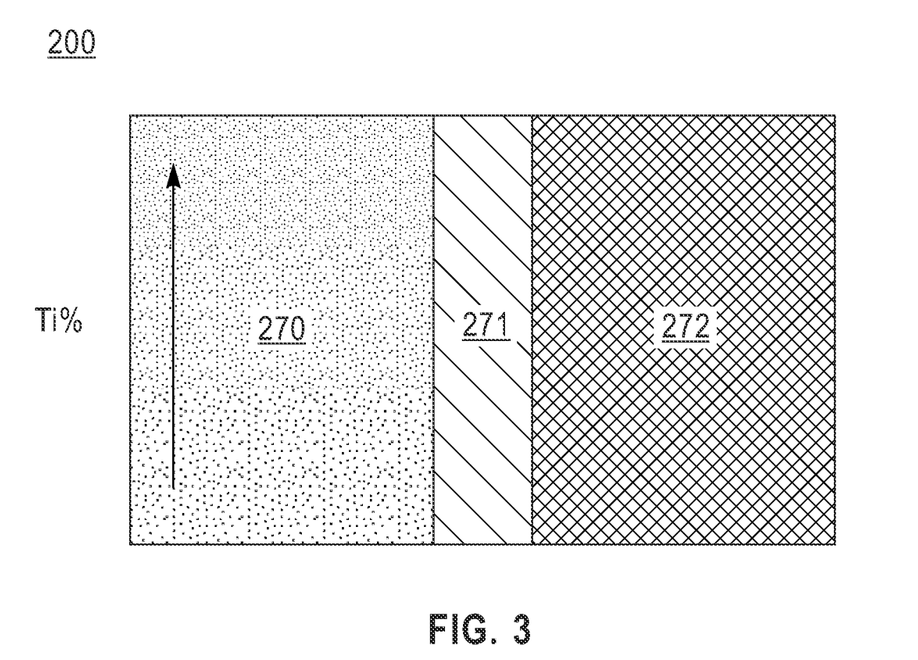
FIG. 3 shows a view of a resistive memory cell formed according to a first embodiment.

A resistive memory cell formed according to a first embodiment is shown in FIG. 3. The resistive memory cell 200 of FIG. 3 shows a structure having a first electrode 270 of a metal-nitride material, i.e., titanium nitride (TiN) with gradually changing metal, i.e., Ti % concentration, a second electrode 272 of a uniform concentration of TiN. The cell includes a middle layer of oxide material, e.g., $HfO_2$. While the resistive memory cell 200 of FIG. 3 is shown as a planar device, it is understood that the memory cell can be a vertically disposed material stack having a first bottom electrode TiN layer of gradually changing Ti concentration, a middle resistive switching layer disposed above the first electrode, and a top electrode of a uniform concentration formed on the middle layer. It is understood that, in the first embodiment, the memory cell can be configured oppositely, e.g., a bottom metal-nitride electrode (e.g., TiN layer) having a uniform concentration and a top electrode TiN layer of a gradually changing Ti concentration.

Different Ti concentrations in the first electrode 270 results in a different concentration of oxygen vacancy in the corresponding section of the RRAM cell. The total resistance of the formed RRAM is equivalent to multiple RRAM in parallel with different concentration of oxygen vacancy (and thus a different resistance change as a response to number of applied pulses or voltage).

Such an RRAM can be used for some applications (e.g., analog computing or neuromorphic applications) in which it is desired to have a gradual change of RRAM resistance instead of simple binary resistance (High resistance/Low resistance) states.

Figure 4:
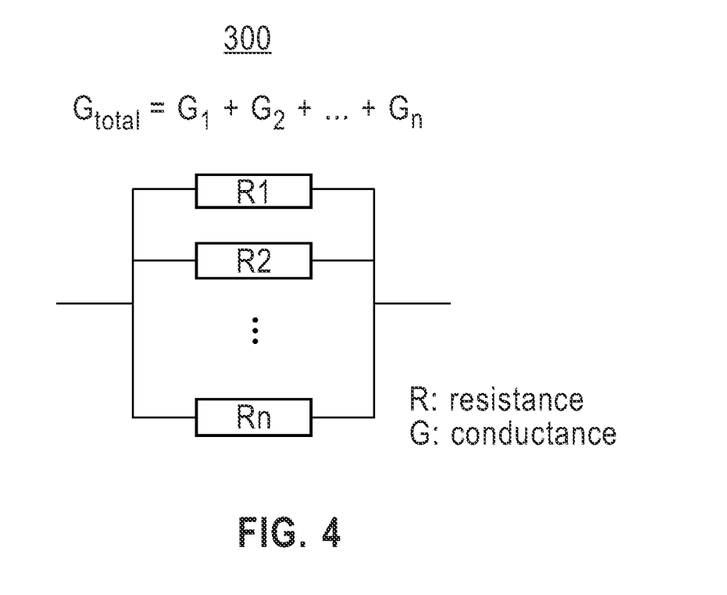
FIG. 4 depicts a computation of the total conductance "G" of a RRAM cell as the sum of conductance of each section R1, R2, . . . , Rn of the RRAM cell.

As conceptually depicted in FIG. 4, the total conductance "G" of a RRAM cell 300 is the sum of conductance (G1, G2, ..., Gn) of each section R1, R2, ..., Rn of the RRAM cell. That is, the total conductance is computed as:

$$G_{total} = G_1 + G_2 + \ldots + G_n$$

In view of the first embodiment of FIG. 3, for the circuit diagram of FIG. 4, the conductance of each mini-conductor R1, R2, etc. is infinitely small and there are infinite number of mini-conductors. The same circuit diagram of FIG. 4 applies to a second embodiment of FIG. 7, however, with the subtle difference being that, for the second embodiment, each conductor R1, R2, etc. corresponds to the conductance of each RRAM with different layers of bottom electrodes.

During a RESET operation, the conductance "G" will not drop sharply due to the different Ti % (oxygen vacancy concentration and thus different RESET characteristics).

Figure 5A:
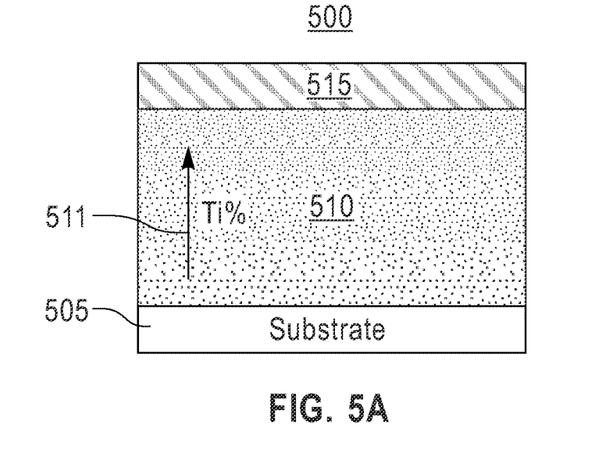
FIGS. 5A-5C depicts method steps for forming the semiconductor RRAM structure of FIG. 3 according to a first embodiment.
Figure 5B:
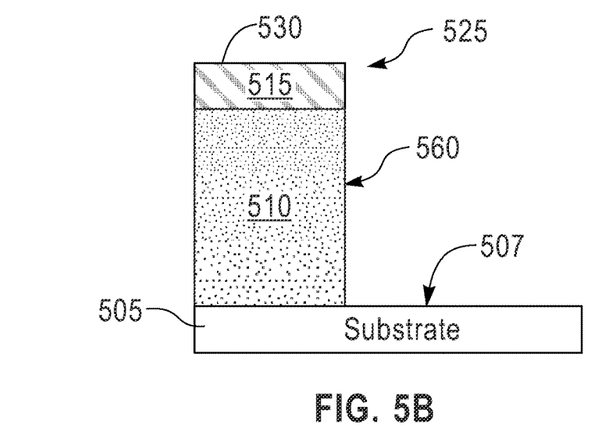
Figure 5C:
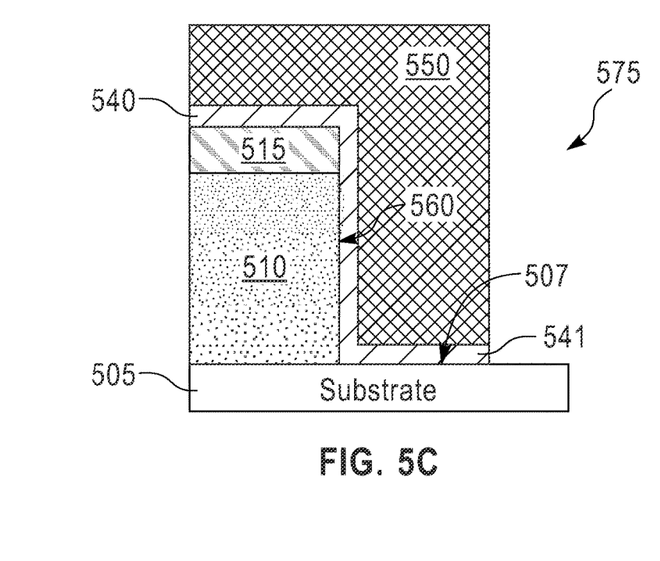

FIGS. 5A-5C depicts method steps 500 for forming the semiconductor RRAM structure 200 of FIG. 2 according to a first embodiment.

Initially, there is provided a semiconductor substrate 505, e.g., at a front-end-of-the-line (FEOL) level, that includes one or more semiconductor devices (not shown) formed on a surface of a semiconductor substrate. The one or more semiconductor devices can include, but are not limited to, transistors, resistors, isolation structures, contacts, and/or diodes. The FEOL level can be formed utilizing techniques that are well known to those skilled in the art.

In other embodiments of the present application, substrate 505 is a lower back-end-of-the (BEOL) level that includes one or more electrically conductive structures that are embedded in one or more interconnect dielectric materials. In such an embodiment, a FEOL level is typically located beneath the lower interconnect level.

Semiconductor substrate 505 includes a bulk semiconductor substrate that may include a semiconductor material or a stack of semiconductor materials such as, for example, Si, Ge, SiGe, SiC, SiGeC, Ge alloys, GaAs, InAs, InP as well as other III/V or II/VI compound semiconductors. In one embodiment, the bulk semiconductor substrate includes a single crystalline semiconductor material such as, for example, single crystalline silicon. The thickness of the bulk semiconductor substrate can be from 30 µm to about 2 mm, although lesser and greater thicknesses can also be employed. The bulk semiconductor substrate may be doped with dopants of p-type or n-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The dopant concentration in the bulk semiconductor substrate can range from $1 \times 10^{14}$ atoms/cm$^3$ to $3 \times 10^{17}$ atoms/cm$^3$.

Alternatively, a semiconductor-on-insulator substrate can be used in place of the bulk semiconductor substrate shown in FIG. 5A.

After providing the semiconductor substrate as described above, a bottom electrode material layer 510 is formed on the surface of the semiconductor substrate. In an embodiment, electrode material layer 510 serving as a bottom electrode of a RRAM memory device can be oriented in a horizontal direction. Each electrode material layer (e.g., electrode material layers 510) is composed of first electrode material such as, for example, titanium nitride (TiN), tantalum nitride (TaN), tungsten (W) or tungsten nitride (WN) or other materials including, but not limited to: tantalum carbide (TaC), titanium carbide (TiC), and titanium aluminum carbide (TiAlC). For the exemplary embodiment depicted in FIG. 2, the first electrode material is TiN having a percent (%) concentration of Ti gradually changing. For example, as shown at 511, a percent concentration of Ti in the TiN layer increases versus the height of the layer 510. The incremental of Ti % as a function of the height of the layer 510 can be linearly, sublinear, super linear, or any other suitable configurations.

The electrode material layer 510 can be formed utilizing a deposition process including, for example, CVD, PECVD, atomic layer deposition (ALD), sputtering or plating. In an embodiment, the percent concentration of Ti increases per time unit as the TiN layer 510 is grown in the vertical direction. When formed, the bottom electrode material layer 510 can have a thickness (i.e., height) ranging from between 30 nm to 300 nm, more preferably between 50 nm to 200 nm, and most preferably between 60 nm to 100 nm, although greater and lesser thicknesses are contemplated.

In an embodiment, to achieve the gradual changing of the metal, e.g., Ti of the TiN material, in an example CVD process, TiN films can be deposited in a reaction chamber by thermally decomposing tetrakis-dimethyl-amino-titanium (TDMAT) precursor in an nitrogen (N2) ambient. The various Ti % can be achieved by gradually tuning the gas flow ratio between TDMAT and N2. In one embodiment, the bottom (first) electrode material layer 510 is formed vertically is processed to achieve a changing concentration Ti % varying from 15% (atomic concentration) to 85%, and more preferably, from 30% to 70%.

For the case of a TaN bottom electrode 510 formed vertically, the process achieves a changing Ta % concentration varying from 25% to 75%.

The bottom electrode serves dual purposes (1) being an electrode and (2) an oxygen scavenging layer, meaning it has interaction with the dielectric layer (e.g., HfOx) to produce oxygen vacancies at the interface between the bottom electrode and HfOx.

In an embodiment, formed above the bottom electrode 510 is a hardmask layer 515. This hardmask layer 515 may be composed of SiN, though other suitable hardmask dielectric materials such as silicon carbide (SiC), silicon oxynitride (SiON), carbon-doped silicon oxide (SiOC), fluorine-doped silicon oxide (SiO:F), silicon-carbon-nitride (SiCN), boron nitride (BN), silicon boron nitride (SiBN), silicoboron carbonitride (SiBCN), silicon oxycabonitride (SiOCN), silicon oxide, and combinations thereof, can be used. The hardmask layer 515 may be formed utilizing a deposition process including, for example, CVD, PECVD, ALD, PVD, sputtering, chemical solution deposition or plating. The hardmask layer 515 may have a thickness from 20 nm to 100 nm; other thicknesses are possible and can be used in the present application as the thickness of the hardmask layer.

FIG. 5B shows a further processing step for shaping a vertical stack memory cell structure comprising the bottom electrode 510 and hardmask layer 515. Although not shown, such processing steps resulting in the structure shown in FIG. 5B can include patterning a photoresist layer (not shown) above the hardmask layer 510 to expose a vertical sidewall 560 of the bottom electrode of the RRAM memory cell. The patterned photoresist may be used as the etch mask during this step of the present application and be composed of a conventional photoresist material. In an embodiment, the etch mask may be formed by deposition of a layer of the photoresist material and photolithography. Then in an embodiment, there may be performed an anisotropic etching process that is selective in removing the physically exposed portions of the structure not protected by the photoresist layer and forming a sidewall 560 of the bottom electrode and exposing a portion 507 of the substrate surface. In one example, a reactive ion etch may be used in removing the physically exposed portions of the hardmask 510 and underlying bottom electrode layer 505 that are not protected by the patterned photoresist layer (not shown). The portion of the patterned RRAM cell stack that remains beneath the patterned photoresist may be referred to herein as a patterned bottom electrode portion 525. Any remaining patterned photoresist layer can be removed utilizing a stripping process such as, for example, ashing.

FIG. 5C shows a resulting RRAM structure 575 formed as a result of further deposition of various material layers, lithography and etching including the depositing of a high-k dielectric material layer (e.g., hafnium oxide, HfOx) 540 upon a top surface 530 of the hardmask layer and exposed aligned sidewall of the hardmask layer and sidewall 560 of the bottom electrode. The depositing of a high-k dielectric material middle layer 540 includes depositing a thin layer portion 541 atop the exposed surface portion 507 of the substrate remaining after the prior anisotropic etch. Then, there is further formed atop the outer surface of the high-k dielectric material middle layer 540, 541 a top electrode layer 550 of the RRAM cell.

In embodiments, the RRAM cell dielectric middle layer 540, 541 can be comprised of a high k gate dielectric. The term "high k" when referring to dielectric layer 540, 541 denotes any transition metal oxide material such as, $HfO_x$, $TiO_x$, $NiO_x$, $WO_x$, $TaO_x$, $VO_x$, $CuO_x$, etc., and can be deposited by atomic layer deposition (ALD) processes or other suitable processes or any suitable combination of multiple processes, including but not limited to, thermal oxidation, chemical oxidation, thermal nitridation, plasma oxidation, plasma nitridation, atomic layer deposition (ALD), chemical vapor deposition (CVD), physical vapor deposition (PVD), molecular beam deposition (MBD), pulsed laser deposition (PLD), liquid source misted chemical deposition (LSMCD), and other like deposition processes. etc. In some embodiments, the HfOx dielectric material layer is a conformal layer. By "conformal layer" it is meant that the thickness of the layer is substantially the same (i.e., ±10%) on all surfaces, or that the variation is less than 15% of the nominal thickness. In one embodiment, the hafnium oxide dielectric layer 540, 541 has a thickness ranging from 2 nm to 20 nm, although more preferably between 3 nm to 10 nm and even 4 nm to 6 nm—although less thickness and greater thickness are also possible.

In FIG. 5C, there is additionally shown the resulting RRAM structure 575 formed as a result of a further deposition and patterning of the top electrode 550. In an embodiment, the top electrode is preferred to be an "inert" conductor, i.e., it serves the sole purpose of being a conductor. The top electrode 550 can be formed by depositing a conductor material or multiple layers of conductors above the high-k dielectric middle layer 540, 541 followed by patterning.

In an embodiment, the top electrode 550 can include a material, including but not limited to, tungsten (W), aluminum (Al), copper (Cu), cobalt (Co), nickel (Ni), titanium (Ti), ruthenium (Ru), molybdenum (Mo), platinum (Pt), or any other suitable conductive material. The metal contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof. In various embodiments, the barrier layer can be deposited in a trench(es) by ALD, CVD, MOCVD, PECVD, or combinations thereof. In various embodiments, the metal fill can be formed by ALD, CVD, PVD, and/or plating, to form the electrical contacts.

With respect to the forming of the top electrode 550, there is additionally patterning step to pattern the top electrode. Patterning can be performed by any suitable patterning techniques, including but not limited to, lithography followed by etching (e.g., reactive ion etch), sidewall image transfer (SIT), self-aligned double patterning (SADP), self-aligned quadruple patterning (SAQP), self-aligned multiple patterning (SAMP), etc.

In an embodiment, the hardmask layer 510 can be removed prior to depositing the dielectric layer 540. If it is removed, a mini RRAM is formed between the top surface of the bottom electrode and the top electrode. In this case, the mini-RRAM has a uniform Ti % bottom electrode.

Figure 6:
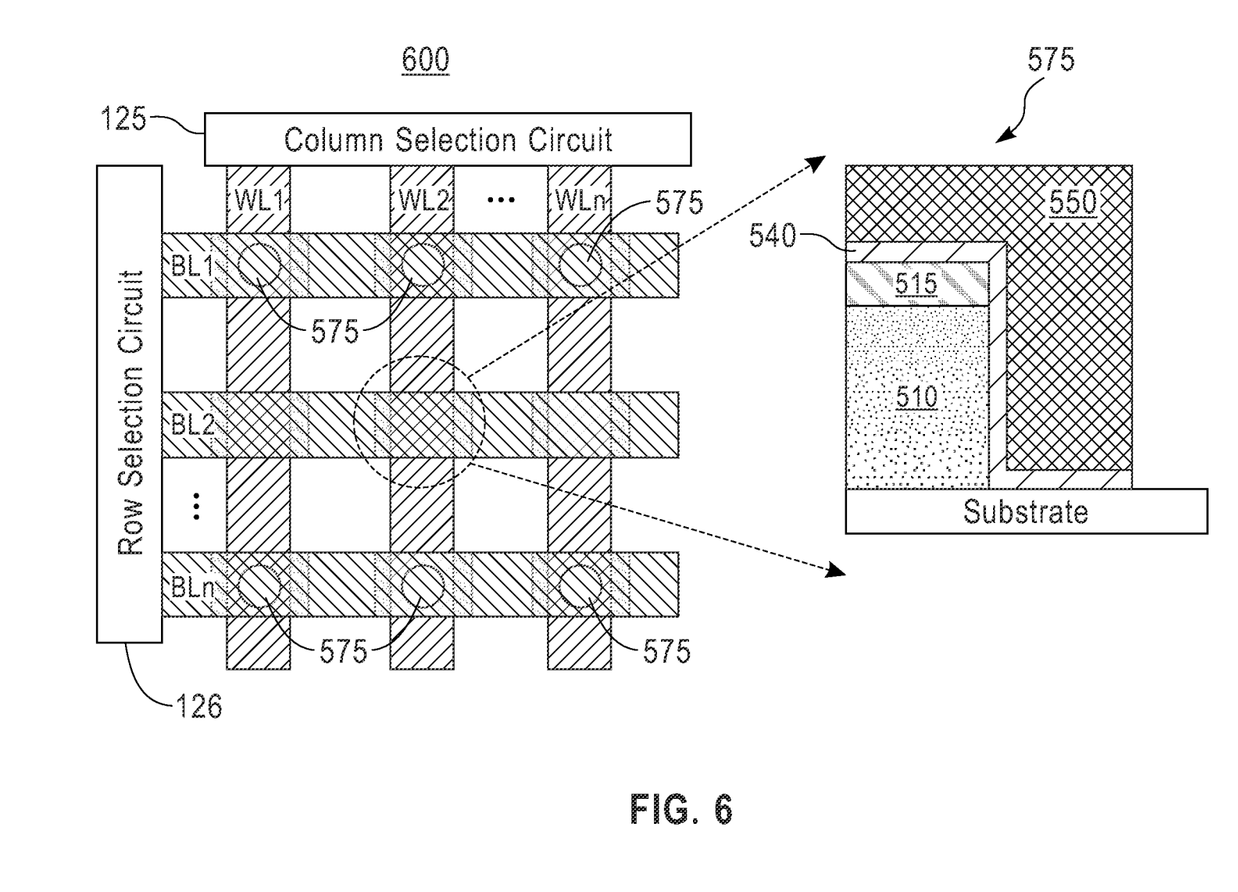
FIG. 6 shows a schematic of a RRAM array having a plurality of RRAM cells, with each RRAM cell including the resistive memory cell of the embodiment shown in FIG. 3.

FIG. 6 shows a schematic of a RRAM array 600 having a plurality of RRAM cells 575, with each RRAM cell 575 comprising a TiN bottom electrode with gradual Ti % concentration, and a uniform top TiN electrode, and the middle HfOx layer between bottom and top electrodes. In the array, each RRAM cell lies at an intersection of a wordline columns WL1, WL2, . . . , WLn connected to a column selection circuit 125 and a bitline row conductor, BL 1, BL2, . . . , BLn connected to a row selection circuit 126. As shown in FIG. 6, top electrodes of memory cells 575 along a single row electrically connect to the bitline (BL) of that row of the array, e.g., when programming the cell or reading a programmed value from the cell. Similarly, the bottom electrodes of memory cells 575 along a single column electrically connect to the wordline (WL) of that column of the array, e.g., when programming the cell or reading a programmed value from the cell. A RRAM memory cell 575 is programmable to store a resistance (or conductance) value at an array location addressed by the column selection circuit 125 and row selection circuit 126. A further sense circuit (not shown) in the RRAM memory array may be implemented to read a voltage or resistance value programmed at the addressed RRAM cell 575. In particular, the different concentrations of the composition in the bottom electrode of the cell 575 result in different concentration of oxygen vacancy in the corresponding section of the RRAM, and the total conductance of the RRAM cell is the sum of conductance of each section of the RRAM cell; and the total resistance of the RRAM cell is equivalent to multiple RRAM sections with different concentration of oxygen vacancy (thus achieving a different resistance change as a response to number of pulses or level of voltage applied via the connected wordline/bitline). Due to different concentrations of oxygen vacancies in different RRAM sections with different Ti % in the bottom electrode, RRAM cell 575 can be programmed such that conductive filaments can be formed gradually in different RRAM sections, depending on the amplitude and duration of an applied electrical pulse or voltage. As a result, the total conductance of the RRAM cell 575 can gradually tuned to different values. When the cell 575 is used for an AI application, the conductance of the cell can be used to represent the weight of a neural network. A gradual conductance change of the cell 575 advantageously enables a gradual adjustment of the weights of neural network.

Figure 7:
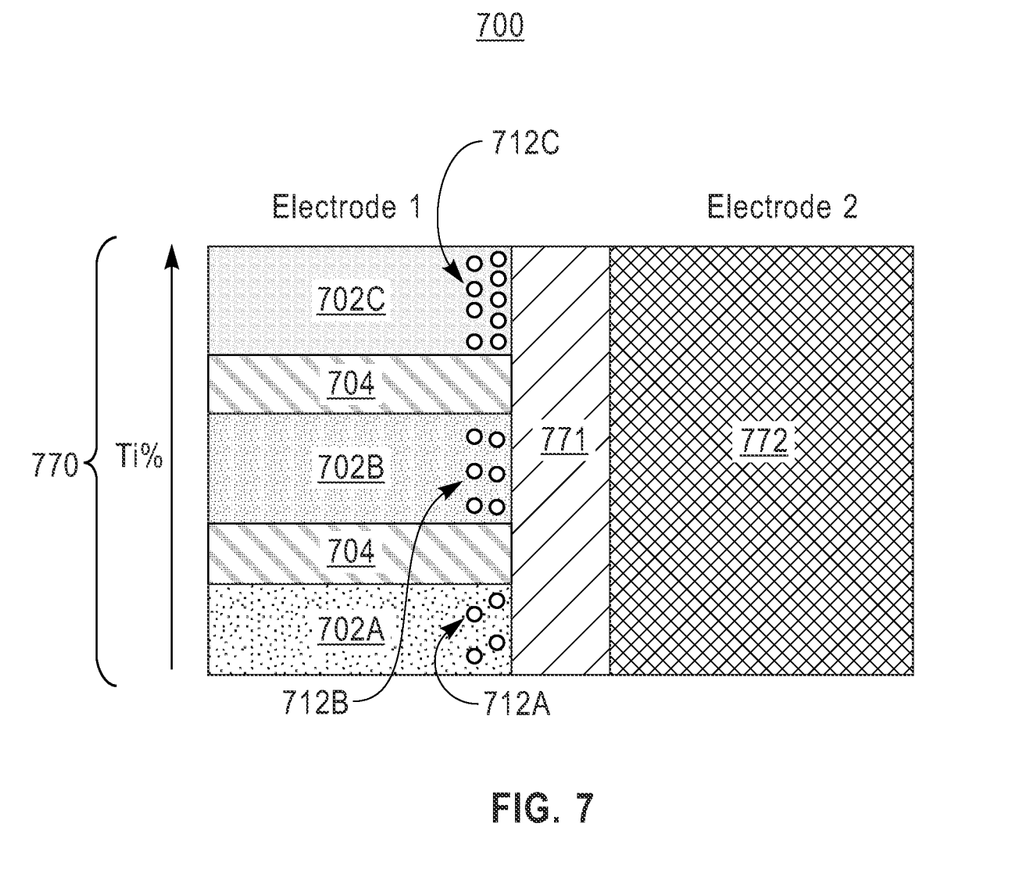
FIG. 7 shows a resistive memory cell structure according to a second embodiment.

FIG. 7 shows a resistive memory cell structure 700 according to a second embodiment.

The RRAM cell structure 700 of FIG. 7 includes a bottom electrode comprising a stack 770 of bottom electrode portions with three parallel-oriented bottom electrode portions or layers, e.g., metal-nitride layers 702A, 702B, 702C shown. The second embodiment can comprise a stack 770 of multiple layers, e.g., metal-nitride material layers, with the metal material concentration being uniform (fixed) but in increasing amounts in each successive level or the metal material concentration gradually increasing in each successive level. The RRAM structure 700 of the second embodiment is not limited to three layers shown and there can be multiple layers. Each layer can comprise a metal-nitride material, e.g., TiN material layer in the embodiment depicted. Each layer includes a different concentration of Ti as in the first RRAM cell structure in the embodiment of FIG. 3. That is, bottom layer 702A includes a fixed or successively increasing amount of percent Ti element concentration as the height of the layer 702A increases. The fixed or successively increasing amount of percent Ti element concentration in the second layer 702B exceeds the Ti metal concentration of the prior first layer 702A and the percent Ti metal element concentration in layer 702B can increase as the height of the layer 702B increases. The fixed or successively increasing amount of percent Ti element concentration in the top bottom electrode layer 702C exceeds the Ti metal concentration of the prior level layer 702B and the percent Ti metal element concentration in layer 702C can increase as the height of the layer 702B increases.

Formed between each successive metal-nitride material layer is an insulator layer 704, e.g., of an insulating material to prevent any potential metal material (e.g., Ti) interaction between adjacent RRAM portions. In an embodiment, each insulator layer is a metal nitride insulator such as SiN, although other insulators can be inserted between the adjacent sections of the varying Ti % bottom electrode 770.

Formed transverse to each bottom electrode layer 702A, 702B, 702C and connecting each bottom electrode layer sidewall of the bottom electrode stack 770 is a middle layer 771 of a resistive switching dielectric material, e.g., a transition metal oxide such $HfO_2$. Formed above the middle layer 771 is a second (top) electrode 772 of a uniform metal-nitride concentration (e.g., TiN). In an embodiment, the second (top) electrode 772 layer is a nitride-rich concentration. It is understood that, in the second embodiment, the memory cell can be configured oppositely, e.g., the bottom metal-nitride electrode (e.g., TiN layer) having a uniform concentration and the top electrode TiN layer having multiple sections that form a gradually changing Ti concentration.

As different Ti concentrations in the first bottom electrode 770 sections result in a different concentration of oxygen vacancy in the corresponding section of the RRAM cell, as shown in the RRAM bottom electrode structure 770, each TiN material layer having varying Ti % exhibits varying oxygen vacancy. That is, as shown in FIG. 7, bottom electrode layer 702A having the least gradual concentration of Ti % exhibits the least amount of oxygen vacancy 712A; the next successive bottom electrode layer 702B having the next increased gradual concentration of Ti % exhibits an increased amount of oxygen vacancy 712B greater than the amount of oxygen vacancy of prior level 712A. The next successive bottom electrode layer 702C having the next increased gradual concentration of Ti % exhibits an increased amount of oxygen vacancy 712C greater than the amount of oxygen vacancy of prior level 712B.

Given that the different Ti concentrations in the first bottom electrode stack structure 770 results in a different concentration of oxygen vacancy in the corresponding layers 702A, 702B, 702C of the RRAM cell, the total resistance of the formed RRAM is equivalent to multiple RRAM in parallel with different concentration of oxygen vacancy (and thus a different resistance change as a response to number of applied pulses or voltage) as shown in the equivalent conductance circuit configuration of FIG. 4 where the total conductance "G" of a RRAM cell 700 is the sum of conductance (G1, G2, . . . , Gn) of each section R1, R2, . . . , Rn of the RRAM cell.

Each bottom electrode alternating layer serves dual purposes of: (1) being an electrode and (2) an oxygen scavenging layer, meaning it has interaction with the dielectric layer (e.g., HfOx) to produce oxygen vacancies at the interface between the bottom electrode and HfOx.

Such an RRAM can be used for some applications (e.g., analog computing or neuromorphic applications) in which it is desired to have a gradual change of RRAM resistance instead of simple binary resistance (High resistance/Low resistance) states.

Figure 8A:
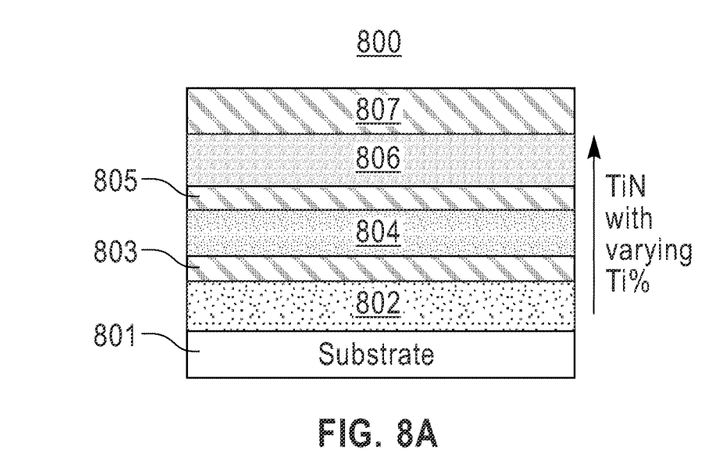
FIGS. 8A-8C depict method steps for forming the resistive memory cell structure of FIG. 7 according to the second embodiment.
Figure 8B:
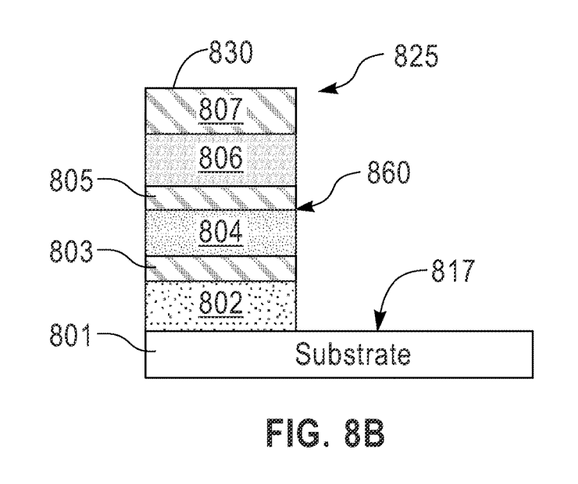
Figure 8C:
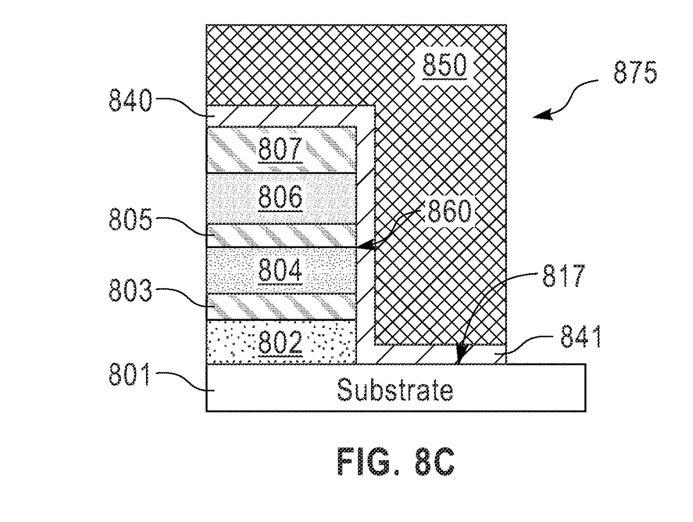

FIGS. 8A-8C depict method steps 800 for forming the semiconductor RRAM structure 700 of FIG. 7 according to the second embodiment.

FIG. 8A illustrates an exemplary structure resulting from initial steps of forming a material stack 800 of alternating layers of bottom electrode material (e.g., bottom metal-nitride electrode material layers 802, 804, 806 each layer with corresponding increased metal material concentration) and hardmask dielectric material layers (e.g., dielectric material layers 803, 805) located on a substrate 801.

The material stack 800, which is present on substrate 801, is formed in the BEOL. As mentioned above, the material stack 800 is composed of alternating layers of bottom electrode material (e.g., bottom metal-nitride electrode material layers 802, 804, 806 each layer with corresponding increased metal material concentration) and hardmask dielectric material layers (e.g., dielectric material layers 803, 805). In the present application, the number of bottom electrode material layers and dielectric hardmask material layers of the material stack 800 can vary so long as each hardmask insulating material layer is sandwiched between successive bottom electrode material layers. In the second embodiment depicted, a top insulating material layer 807 is formed above the topmost bottom electrode material layer 806.

Each hardmask insulating material layer can be composed of a dielectric material such as, for example, silicon nitride, however, can be any other suitable dielectric material, including but not limited to: silicon carbide (SiC), silicon oxynitride (SiON), carbon-doped silicon oxide (SiOC), fluorine-doped silicon oxide (SiO:F), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. Each hardmask layer 803, 805, 807 may have a thickness from 20 nm to 100 nm although other thicknesses are possible and can be used in the present application as the thickness of the hardmask layers.

Each bottom electrode material layer (e.g., electrode material layers 802, 804, 806) is composed of first electrode material such as, for example, tungsten (W), aluminum (Al), copper (Cu), cobalt (Co), nickel (Ni), titanium (Ti), ruthenium (Ru), molybdenum (Mo), platinum (Pt), or any other suitable conductive material. The metal contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof. For the exemplary second embodiment depicted in FIG. 7, the alternating electrode material layers 802, 804, 806 is TiN having a percent (%) concentration of Ti that changes, with increasing gradual Ti material concentrations for each successive layer 802, 804, 806. For example, each successive layer can have a fixed Ti %. For example, the bottom layer 802 has 30% Ti % concentration, the middle layer 804 has 50% Ti % concentration, and the top layer 806 has 70% Ti % concentration. In an alternative embodiment, the Ti % can also vary within each layer 802, 804, 806. For example, the incremental of Ti % as a function of the height of the layer 510 can be linear, sublinear, super linear, or any other suitable configurations.

Each bottom electrode material layer 802, 804, 806 can be formed utilizing a deposition process including, for example, CVD, PECVD, atomic layer deposition (ALD), sputtering or plating. In an embodiment, the percent concentration of Ti increases per time unit as each TiN layer 802, 804, 806 is grown in the vertical direction. When formed, each individual bottom electrode material layer 802, 804, 806 can have a thickness (height) ranging from between 5 nm to 60 nm, more preferably between 10 nm to 30 nm, and most preferably 20 nm to 30 nm. Each TiN electrode material layer 802, 804, 806 can have the same thickness or different thicknesses.

FIG. 8B shows a further processing step for shaping a vertical stack memory cell structure comprising the bottom electrode stack 800 of bottom electrode layers 802, 804, 806 and intermediate 810 and hardmask layers 803, 805, 807. Although not shown, such processing steps resulting in the structure shown in FIG. 8B can include patterning a photoresist layer (not shown) above the topmost hardmask layer 807 to expose a vertical sidewall 860 of the bottom electrode of the RRAM memory cell. The patterned photoresist may be used as the etch mask during this step of the present application and be composed of a conventional photoresist material. In an embodiment, the etch mask may be formed by deposition of a layer of the photoresist material and photolithography. Then in an embodiment, there may be performed an anisotropic etching process that is selective in removing the physically exposed portions of the structure not protected by the photoresist layer and forming a sidewall 860 of the bottom electrode and exposing a portion 817 of the substrate surface. In one example, a reactive ion etch may be used in removing the physically exposed portions of the alternating bottom electrode layers 802, 804, 806 and intermediate 810 and hardmask layers 803, 805, 807 that are not protected by the patterned photoresist layer (not shown). The portion of the patterned RRAM cell stack that remains beneath the patterned photoresist may be referred to herein as a patterned bottom electrode portion 825. Any remaining patterned photoresist layer can be removed utilizing a stripping process such as, for example, ashing.

FIG. 8C shows a resulting RRAM structure 875 formed as a result of further deposition of various material layers, lithography and etching including the depositing of a high-k dielectric material layer (e.g., hafnium oxide, HfOx) 840 upon a top surface 830 of the top hardmask layer 807 and exposed aligned sidewall of the hardmask layer and bottom electrode sidewall 860 resulting from the etching of the alternating hardmask and bottom electrode layers. The depositing of a high-k dielectric material middle layer 540 includes depositing a thin layer portion 841 atop the exposed surface portion 817 of the substrate remaining after the prior anisotropic etch. Then, there is further formed atop the outer surface of the high-k dielectric material middle layer 840, 841 a top electrode layer 850 of the RRAM cell 700.

In embodiments, the RRAM cell dielectric middle layer 840, 841 can be comprised of a high k gate dielectric. The term "high k" when referring to dielectric layer 540, 541 denotes any transition metal oxide material such as, $HfO_x$, $TiO_x$, $NiO_x$, $WO_x$, $TaO_x$, $VO_x$, $CuO_x$, etc., and can be deposited by atomic layer deposition (ALD) processes or other suitable processes or any suitable combination of multiple processes, including but not limited to, thermal oxidation, chemical oxidation, thermal nitridation, plasma oxidation, plasma nitridation, atomic layer deposition (ALD), chemical vapor deposition (CVD), physical vapor deposition (PVD), molecular beam deposition (MBD), pulsed laser deposition (PLD), liquid source misted chemical deposition (LSMCD), and other like deposition processes. etc. In some embodiments, the HfOx dielectric material layer 840, 841 is a conformal layer having a thickness ranging from 2 nm to 20 nm, although more preferably between 3 nm to 10 nm and even 4 nm to 6 nm—although less thickness and greater thickness are also possible.

In FIG. 8C, there is additionally shown the resulting RRAM structure 875 formed as a result of a further deposition and patterning of the top electrode 850. In an embodiment, the top electrode is preferred to be an "inert" conductor, i.e., it serves the sole purpose of being a conductor. The top electrode 850 can be formed by depositing a conductor material or multiple layers of conductors above the high-k dielectric middle layer 840, 841 followed by patterning.

In an embodiment, the top electrode 850 can include a material, including but not limited to, tungsten (W), aluminum (Al), copper (Cu), cobalt (Co), nickel (Ni), titanium (Ti), ruthenium (Ru), molybdenum (Mo), platinum (Pt), or any other suitable conductive material. The metal contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof. In various embodiments, the barrier layer can be deposited in a trench(es) by ALD, CVD, MOCVD, PECVD, or combinations thereof. In various embodiments, the metal fill can be formed by ALD, CVD, PVD, and/or plating, to form the electrical contacts.

Figure 9:
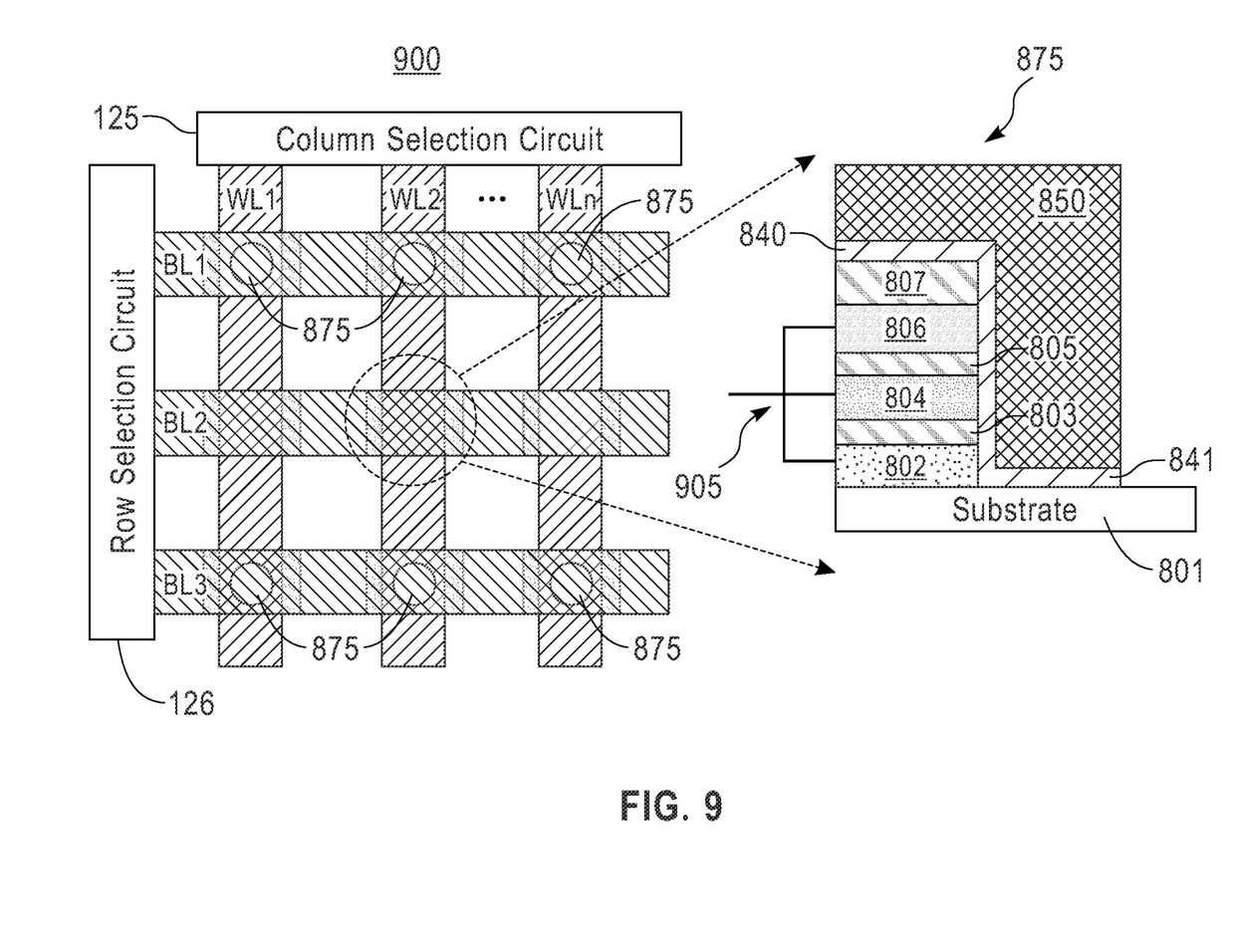
FIG. 9 shows a schematic of a RRAM array having a plurality of RRAM cells, with each RRAM cell including the resistive memory cell of the embodiment shown in FIG. 7.

FIG. 9 shows a schematic of a RRAM array 900 having a plurality of RRAM cells 875, with each RRAM cell 875 including a bottom metal nitride electrode composed of a stack of alternating layers of TiN material, with each successive layer of the stack having a different fixed (or varied) Ti % concentration, and a uniform top TiN electrode, and the middle HfOx layer between the bottom and top electrodes. In the array, each RRAM cell lies at an intersection of a wordline columns WL1, WL2, . . . , WLn connected to a column selection circuit 125 and a bitline row conductor, BL 1, BL2, . . . , BL n connected to a row selection circuit 126. As shown in FIG. 9, top electrodes of memory cells 875 along a single row electrically connect to the bitline (BL) of that row of the array, e.g., when programming the cell or reading a programmed value from the cell Similarly, the bottom electrode layer of the memory cell 875 along a single column electrically connect to the wordline (WL) of that column of the array, e.g., when programming the cell or reading a programmed value from the cell. In an embodiment, there is a conductor wire network 905 formed that electrically connects all TiN electrode layers 802, 804, 806 of a cell together to the respective wordline. A RRAM memory cell 875 is programmable to store a resistance (or conductance) value, e.g., at an array location addressed by the column selection circuit 125 and row selection circuit 126. A further sense circuit (not shown) in the RRAM memory array may be implemented to read a voltage or resistance value programmed at the addressed RRAM cell 875. The different concentrations of the composition in each respective bottom electrode layer 802, 804, 806 of the cell 875 result in different concentration of oxygen vacancy in the corresponding section of the RRAM cell, and the total conductance of the RRAM cell is the sum of conductance of each section of the RRAM cell; and the total resistance of the RRAM cell is equivalent to multiple RRAM sections with different concentration of oxygen vacancy (thus achieving a different resistance change as a response to number of pulses or level of voltage applied via the connected wordline/bitline). Due to different concentrations of oxygen vacancies in different RRAM sections with different Ti % in the bottom electrode, RRAM cell 875 can be programmed such that conductive filaments can be formed gradually in different RRAM sections, depending on the amplitude and duration of an applied electrical pulse or voltage. As a result, the total conductance of the RRAM cell 875 can gradually tuned to different values. When the cell 875 is used for an AI application, the conductance of the cell can be used to represent the weight of a neural network. A gradual conductance change of the cell 875 advantageously enables a gradual adjustment of the weights of neural network.

The RRAM array embodiments depicted in FIGS. 6 and 9 is advantageously employed in neuromorphic computing applications, with a resistive memory device used as a connection (i.e., a synapse) between a pre-neuron and a post-neuron, representing the connection weight in the form of device resistance. Multiple pre-neurons and post-neurons can be connected through a crossbar array of RRAMs, which naturally expresses a fully connected neural network.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A resistive memory device comprising:
a first electrode layer having a metal containing material composition of a gradually changing percent concentration of metal material;
a resistive switching material layer having a first sidewall surface, the first sidewall surface abutting a sidewall surface of the first electrode, wherein a different height along the first sidewall surface of the resistive switching material layer abuts a respective different sidewall surface location of the first electrode layer, the first electrode layer having a respective different metal material percent concentration at a height corresponding to the respective different sidewall surface location; and
a second electrode abutting a second sidewall surface of the resistive switching material layer, the second electrode having a uniform concentration of metal material.

2. The resistive memory device of claim 1, wherein the resistive switching material layer is a transition-metal oxide material.

3. The resistive memory device of claim 1, wherein the first electrode layer comprises a metal-nitride material, wherein the metal containing material composition comprises a gradual percent increase of a concentration of the metal material in the first electrode layer.

4. The resistive memory device of claim 3, connected in an addressable array of resistive memory cells having selectable wordline conductors and bitline conductors connected to circuits for programming a resistive memory cell in the array, wherein the first electrode layer electrically connects to a wordline conductor and the second electrode electrically connects to a bitline conductor.

5. The resistive memory device of claim 4, wherein the gradual percent increase of a concentration of metal material varies vertically from a bottom to a top of said first electrode layer, said varying concentration of the composition resulting in different concentration of oxygen vacancy in a corresponding section of the memory device, and wherein a total conductance of the RRAM is the sum of conductance of each section of the RRAM, said memory device achieving a different resistance change in response to a number of pulses or level of voltage applied via a connected wordline/bitline.

6. The resistive memory device of claim 1, further comprising:
   a hardmask insulating layer formed atop a surface of the first electrode layer, said resistive switching material layer further disposed over a top surface and sidewall surface of the hardmask insulating layer.

* * * * *